United States Patent
Baumgarte

(10) Patent No.: US 7,639,823 B2
(45) Date of Patent: Dec. 29, 2009

(54) AUDIO MIXING USING MAGNITUDE EQUALIZATION

(75) Inventor: Frank Baumgarte, Sunnyvale, CA (US)

(73) Assignee: Agere Systems Inc., Allentown, PA (US)

( * ) Notice: Subject to any disclaimer, the term of this patent is extended or adjusted under 35 U.S.C. 154(b) by 1080 days.

(21) Appl. No.: 10/853,394

(22) Filed: May 25, 2004

(65) Prior Publication Data

US 2005/0195995 A1 Sep. 8, 2005

Related U.S. Application Data

(60) Provisional application No. 60/549,781, filed on Mar. 3, 2004.

(51) Int. Cl.
*H04B 1/00* (2006.01)
*H04R 5/00* (2006.01)
*H03G 3/00* (2006.01)

(52) U.S. Cl. ............................ 381/119; 381/17; 381/18; 381/107

(58) Field of Classification Search ................. 381/199, 381/101, 102, 103, 107, 21–22, 17–18, 119
See application file for complete search history.

(56) References Cited

U.S. PATENT DOCUMENTS

| | | | |
|---|---|---|---|
| 5,636,324 A | 6/1997 | Teh et al. | 315/2.35 |
| 5,812,969 A | 9/1998 | Barber, Jr. et al. | 704/224 |
| 2004/0032960 A1* | 2/2004 | Griesinger | 381/104 |

OTHER PUBLICATIONS

"A New Digital Surround Processing System for General A/V Sources", by Yeongha Choi et al., IEEE Transactions on Consumer Electronics, New York, vol. 41, No. 4, Nov. 1, 1995, pp. 1174-1180, XP000553496.

"One-Shot Digital Equalization for Nonlinear Modulations", by Angelo Bernardini et al., Conference Proceedings Article, Mar. 19, 1992, pp. 252-263.

"DSP-Implementation of a Multiband Loudness Correction Hearing Aid", by Thomas Fröhlich et al., Proceedings of the Annual International Conference of the IEEE Orlando, Florida, Oct. 3-Nov. 31, 1991, pp. 1889-1890.

"Audio Coder Enhancement Using Scalable Binaural Cue Coding With Equalized Mixing", by Rank Baumgarte et al., Audio Engineering Society Convention Papers, New York, pp. 1-9, May 8-11, 2004.

* cited by examiner

*Primary Examiner*—Vivian Chin
*Assistant Examiner*—Douglas J Suthers
(74) *Attorney, Agent, or Firm*—Mendelsohn, Drucker & Associates, P.C.; Steve Mendelsohn

(57) ABSTRACT

According to one embodiment, during mixing of an N-channel input signal to generate an M-channel output signal, in at least one frequency sub-band, magnitude equalization is applied to the mixed channel signals such that an amplitude sum magnitude for the N input channels (e.g., the magnitude of a sum of estimated amplitudes of the N input channels) is approximately equal to an amplitude sum magnitude for the M output channels (e.g., the magnitude of a sum of estimated amplitudes of the M output channels). In one implementation, magnitude equalization is applied to one or more sub-bands (e.g., those below 1 kHz), and power equalization is applied to one or more other sub-bands (e.g., those above 1 kHz) to reduce coloration effects in the output signal.

18 Claims, 3 Drawing Sheets

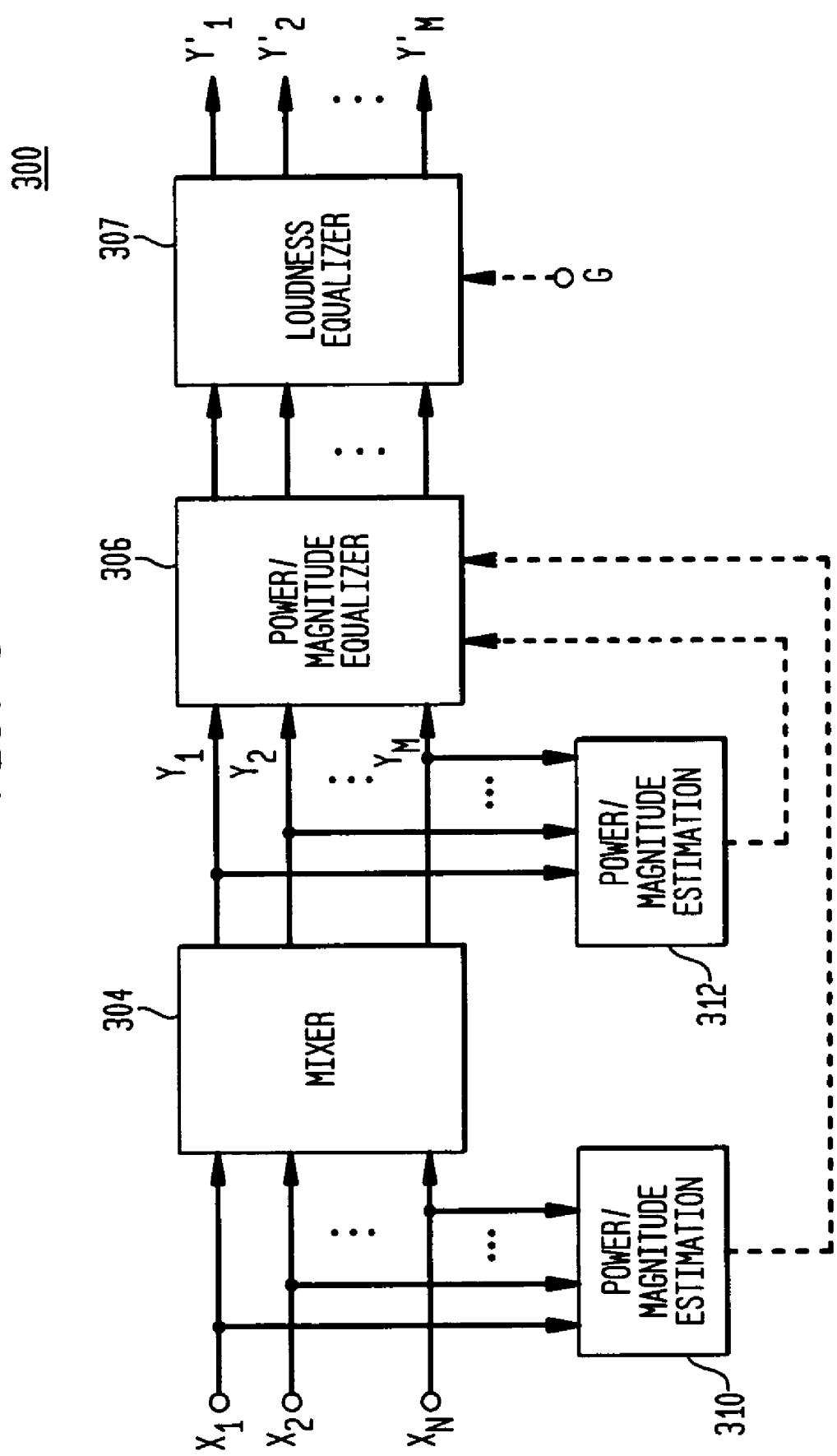

AUDIO MIXING USING MAGNITUDE EQUALIZATION

CROSS-REFERENCE TO RELATED APPLICATIONS

This application claims the benefit of the filing date of U.S. provisional application No. 60/549,781, filed on Mar. 3, 2004, the teachings of which are incorporated herein by reference.

The subject matter of this application is related to the subject matter of U.S. patent application Ser. No. 10/246,165, filed on Sep. 18, 2002, the teachings of which are incorporated herein by reference.

BACKGROUND OF THE INVENTION

1. Field of the Invention

The present invention relates to audio signal processing and, in particular, to mixing audio signals.

2. Description of the Related Art

A common problem in many areas of audio recording, audio production, and audio coding is the mixing of a number of input audio channels to generate a different number of output audio channels. The change in the number of channels can be motivated by, e.g., a difference between the number of audio tracks (channels) of the recording device and the number of channels supported by the playback system or a difference between the number of channels of the distribution medium (e.g., CD, DVD, radio) and the number of channels supported by the playback system.

One example is FM radio where audio is usually delivered as a two-channel stereo signal, but many receivers have only one playback channel (one loudspeaker). In such case, the two stereo channels are typically down-mixed to form a single mono audio signal for playback. Another example of down-mixing occurs when the multiple (e.g., five) channels of an input signal conforming to a surround audio format, e.g., 5.1 surround, are down-mixed for playback, e.g., using a two-channel stereo system.

In addition to down-mixing (i.e., where the number of output channels is less than the number of input channels), mixing of audio signals may involve up-mixing (i.e., where the number of output channels is greater than the number of input channels). An example of up-mixing is the generation of a three-channel output signal (e.g., left, right, and center) from a two-channel (e.g., left, right) input signal.

Both down-mixing and up-mixing should be performed using processes that degrade the spatial image quality as little as possible. In a conventional mixing process, each output channel is derived from a weighted summation of the input channels in the time domain, where "panning laws" or "matrixing schemes" are applied to determine the weight of each input channel for each output channel.

By operating on signals in the time domain, conventional mixing techniques are applied to the full bandwidth of the audio channels. One drawback of such mixing techniques is a possible loss of spectral energy and/or loudness when some of the spectral components of the input audio channels are not aligned in phase. Such phase differences commonly occur, for instance, in multiple-microphone recordings, when each microphone has a different distance to the sound source. As a result, different phases are introduced in the microphone signals. In the extreme case of a 180-degree phase shift between two input channels of the same amplitude, an output channel composed of the input-channel sum would have zero energy since the input signals would cancel each other. In a realistic scenario, the signal energy and/or loudness can significantly drop for some spectral components in the output channels due to the misaligned signal phases. This energy/loudness loss is audible as a coloration effect.

Coloration effects were studied to a large extent in the framework of the "mono-compatibility" problem at the time when two-channel stereo sound was widely introduced in the 1950's and 60's. See, e.g., F. K. Harvey and E. H. Uecke, "Compatibility problems in two-channel stereophonic recordings," 13$^{th}$ AES meeting, preprint 197, October 1961, the teachings of which are incorporated herein by reference. The goal of these studies was to find ways to create a two-channel stereo signal that would largely maintain the perceived loudness over frequency when both channels are mixed to mono. Some sample solutions are to impose a phase shift of +45 and −45 degrees on the left and right audio signals, respectively, before summation or to use coincidence microphones for the recording (where both microphones have the same distance from the sound source). Although these techniques tend to reduce the coloration effect for particular situations, there are many audio processing applications in which these techniques either cannot be applied and/or will not provide satisfactory results.

SUMMARY OF THE INVENTION

Ser. No. 10/246,165 describes an equalized mixing technique that enables the energy and/or loudness levels of a mixer's output signals to match the energy and/or loudness levels of the mixer's input signals, such that coloration effects are reduced and possibly avoided. In one embodiment, the time-domain channel signals of an N-channel input signal are transformed to a frequency domain, where the resulting spectral components are down-mixed to form a single sum channel, which is then adaptively amplified in order to adjust for loss of spectral energy and/or loudness during the mixing process. An inverse transform is then applied to the resulting equalized sum channel spectrum to generate a single time-domain output signal.

Examples of the technique taught in Ser. No. 10/246,165 rely on short-term energy equalization, in which the short-term energy is estimated independently for each input channel and for the sum channel at the mixer output. The sum channel is then amplified so that it has the same short-term energy as the energy sum of all mixer input channels. This approach eliminates virtually all phase dependencies in the mixing process. The equalization is applied independently in different sub-bands of the audio spectrum.

Short-term energy equalization is an appropriate solution for audio frequencies above approximately 1 kHz. However, below 1 kHz, this approach can result in a coloration effect, e.g., a loudness increase that can become audible as the bass level increases.

According to certain embodiments of the present invention, for one or more—and possibly all—frequency sub-bands, the short-term energy equalization technique of Ser. No. 10/246,165 is replaced by a magnitude equalization technique. For example, in one embodiment, short-term energy equalization is applied to sub-bands above 1 kHz, while magnitude equalization is applied to sub-bands below 1 kHz. According to certain implementations, magnitude equalization takes into account phase differences, because audio signals add up in a similar way at the ear entrances at low frequencies for loudspeaker playback. At high frequencies, short-term energy equalization is appropriate, because there is an acoustical head-shadow effect that prevents the summation of the different channels at the two ears for loudspeaker playback.

The mixing techniques of the present invention can be applied in many different audio coding and sound engineering applications involving the mixing of audio signals.

In one embodiment, the present invention is a method for generating M output audio channels from N input audio channels, where N and M are positive integers. According to the method, the N input channels are mixed to generate M mixed channels, and the M mixed channels are equalized to generate the M output channels, wherein, for a first set of one or more frequency sub-bands, the amplitude of each of the M mixed channels is scaled such that an amplitude sum magnitude for the M output channels (e.g., the magnitude of a sum of estimated amplitudes of the M output channels) is substantially equal to an amplitude sum magnitude for the N input channels (e.g., the magnitude of a sum of estimated amplitudes of the N input channels).

In another embodiment, the present invention is an M-channel audio signal generated by the previously described method.

In yet another embodiment, the present invention is an apparatus for generating M output audio channels from N input audio channels, where N and M are positive integers. The apparatus comprises an input estimation block, a mixer, an output estimation block, and an equalizer. The input estimation block estimates amplitudes of the N input channels for a first set of one or more frequency sub-bands. The mixer mixes the N input channels to generate M mixed channels. The output estimation block estimates amplitudes of the M mixed channels for the first set. The equalizer equalizes the M mixed channels to generate the M output channels, where, for the first set, the equalizer scales the amplitude of each of the M mixed channels such that a magnitude of a sum of the estimated amplitudes of the M output channels is substantially equal to a magnitude of a sum of the estimated amplitudes of the N input channels.

Without specifying particular ranges, as used in this specification, two values may be said to be "substantially equal" when any deviations from exact mathematical equality result from the levels of measurement and computational accuracies expected and resulting from the particular devices and techniques used to implement the invention.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

FIG. 3 shows a block diagram of a portion of an equalized mixer, according to one embodiment of the present invention.

DETAILED DESCRIPTION

Short-Term Energy Equalization

Figure 1:
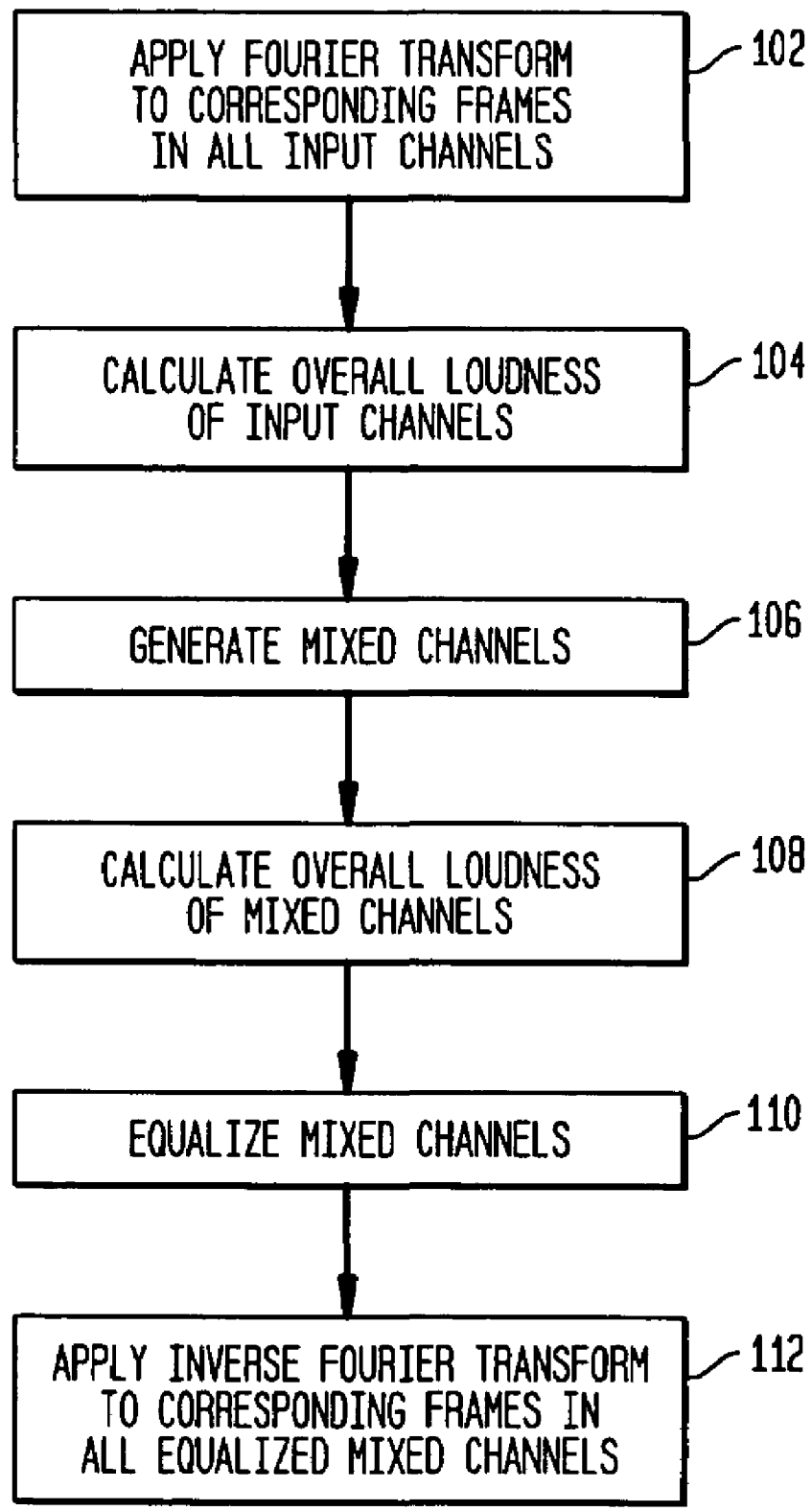
FIG. 1 shows a flow diagram of an equalized mixing procedure, according to one embodiment of the teachings in Ser. No. 10/246,165.
Figure 2:
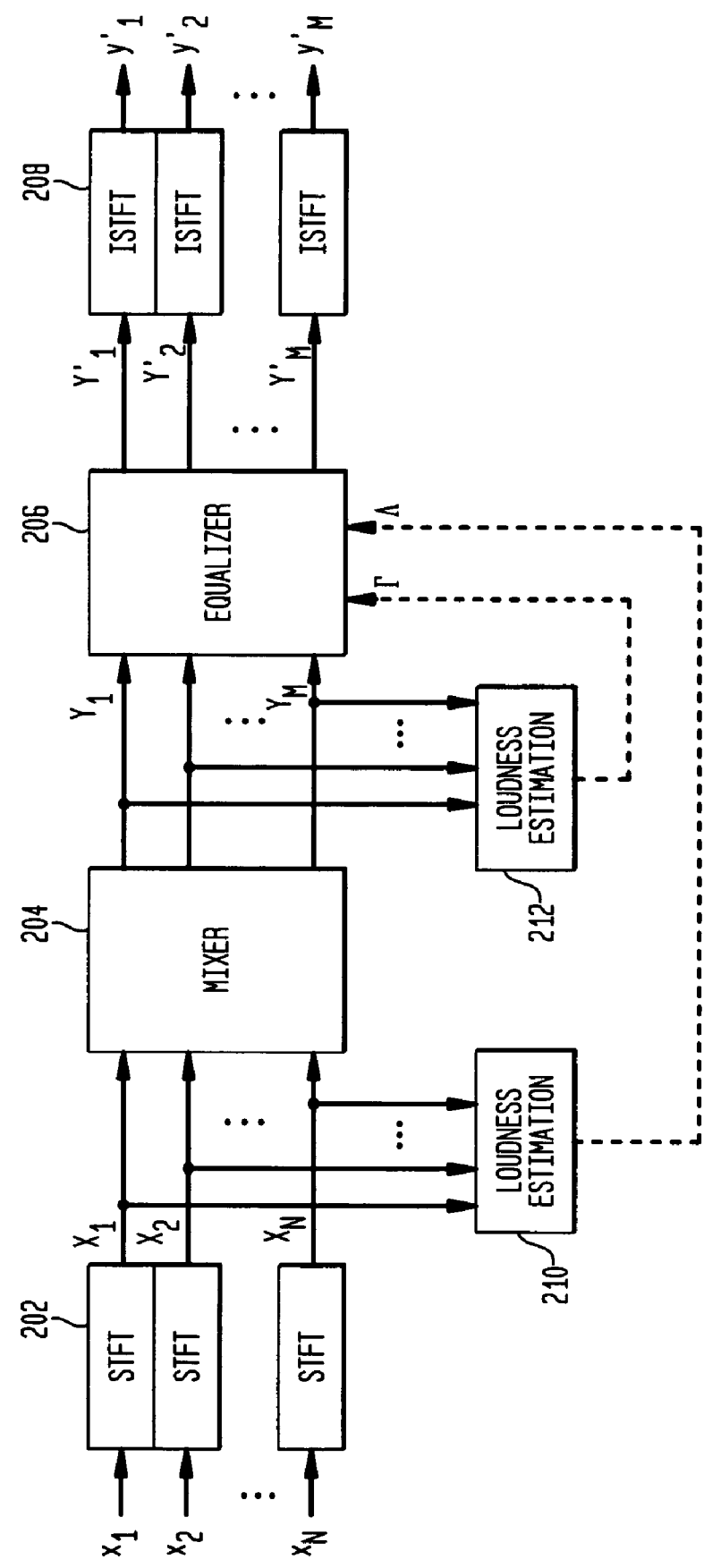
FIG. 2 shows a block diagram of an equalized mixer, according to one embodiment of the teachings in Ser. No. 10/246,165.

As described in Ser. No. 10/246,165, FIGS. 1 and 2 illustrate how an equalized mixer (e.g., 200 of FIG. 2) performs short-term energy equalization (also referred to herein as power equalization) to mix an N-channel time-domain input audio signal to generate an M-channel time-domain output audio signal, where the input signal has N time-domain channel signals $x_n(t)$, n=1, . . . , N, and the output signal has M time-domain channel signals $y'_m(t)$, m=1, . . . , M. For downmixing applications, N>M≧1. For example, when downmixing a stereo input signal to a mono output signal, N=2 and M=1. For up-mixing applications, 1≦N<M. For example, when up-mixing a stereo input signal to a three-channel output signal, N=2 and M=3. It is also possible for a mixing application to have the same number of input and output channels (i.e., N=M>1).

As shown in FIG. 2, equalized mixer 200 has N short-time Fourier transform (STFT) blocks 202, a frequency-domain mixer 204, a frequency-domain equalizer 206, and M inverse short-time Fourier transform (ISTFT) blocks 208. In addition, equalized mixer 200 has two loudness estimation blocks 210 and 212. Each transform block 202 performs part of step 102 of FIG. 1 to transform a different channel signal of an N-channel input signal into the frequency domain. Loudness estimation block 210 performs step 104 of FIG. 1 to calculate (and smooth) the overall estimated loudness Γ of the N-channel input signal. Mixer 204 performs step 106 of FIG. 1 to generate M mixed spectra. Loudness estimation block 212 performs step 108 of FIG. 1 to calculate (and smooth) the overall estimated loudness Λ of the M mixed spectra. Equalizer 206 performs step 110 of FIG. 1 to equalize the M mixed spectra. Each ISTFT block 208 performs part of step 112 of FIG. 1 to transform a different one of the resulting M equalized mixed spectra to the time domain, thereby generating a different channel of an M-channel output signal. Each of these steps is described in fuller detail in Ser. No. 10/246,165.

Power/Magnitude Equalization

FIG. 3 shows a block diagram of a portion of an equalized mixer 300, according to one embodiment of the present invention. Like equalized mixer 200 of FIG. 2, equalized mixer 300 can be configured to mix an N-channel time-domain input audio signal to generate an M-channel time-domain output audio signal, where the input signal has N time-domain channel signals $x_n(t)$, n=1, . . . , N, and the output signal has M time-domain channel signals $y'_m(t)$, m=1, . . . , M, where N is either greater than, equal to, or less than M depending on the particular application.

Although not shown in FIG. 3, like equalized mixer 200, equalized mixer 300 can be configured with N STFT blocks at its input, which convert frames of the N time-domain input channel signals $x_n(t)$ into the N frequency-domain channel signals $X_n(\omega)$, which are shown in FIG. 3. In order to improve the spectral resolution, the STFT transform preferably includes the application of a window function when generating each time-domain signal frame from a continuous time signal. According to a typical window function, consecutive windows overlap in time, e.g., by 50% of the length of each window.

Similarly, equalized mixer 300 can be configured with M ISTFT blocks (not shown) at its output, which convert the M frequency-domain channel signals $Y'_m(\omega)$ shown in FIG. 3 into the M time-domain output channel signals $y'_m(t)$. When overlapping frames are employed, an overlap-add procedure with the previous frame should be implemented.

Unlike equalized mixer 200, equalized mixer 300 does not perform loudness estimation. Instead, equalized mixer 300 can produce equal loudness at its output based on a combination of power/magnitude estimation and a frequency-dependent, non-adaptive gain function G. This gain function can be found by analysis of acoustic playback scenarios and based on the properties of the power/magnitude equalizer. In one embodiment, the present invention involves a low-complexity estimation and equalization scheme that is able to support loudness equalization with a relatively simple (non-adaptive) gain function G.

In addition to the STFT and ISTFT blocks, as shown in FIG. 3, equalized mixer 200 has a frequency-domain mixer 304, a frequency-domain power/magnitude equalizer 306, an optional frequency-domain loudness equalizer 307, and two power/magnitude estimation blocks 310 and 312. Equalized mixer 300 performs band-based mixing with either a power equalization technique or a magnitude equalization technique being applied to each frequency sub-band. For example, in one implementation, equalized mixer 300 performs mixing with power equalization for each sub-band whose center frequency is greater than or equal to 1 kHz and mixing with magnitude equalization for each sub-bands whose center frequency is less than 1 kHz. Depending on the particular application, it might be possible to improve the coloration reduction by choosing a different threshold frequency, e.g., from the range of 500 to 1000 Hz.

Note that, in general, for each sub-band, equalized mixer 300 can perform mixing with or without power/magnitude equalization, independent of each other sub-band. For example, equalized mixer 300 can be configured to perform mixing with magnitude equalization for one or more sub-bands and mixing without any equalization for one or more other sub-bands. Equalized mixer 300 can also be configured to perform mixing with magnitude equalization for all sub-bands.

For those sub-bands for which equalized mixer 300 performs mixing with power equalization, estimation blocks 310 and 312 are configured to perform power estimation, and equalizer 306 is configured to perform power equalization. Similarly, for those sub-bands for which equalized mixer 300 performs mixing with magnitude equalization, estimation blocks 310 and 312 are configured to perform magnitude estimation, and equalizer 306 is configured to perform magnitude equalization. In either case, equalizer 306 applies some degree of coloration reduction to the signals generated by mixer 304. After that, loudness equalizer 307 can be optionally employed to apply an additional, refined degree of coloration reduction, if appropriate.

FIG. 3 shows mixer 304, power/magnitude equalizer 306, and loudness equalizer 307 as three distinct elements. While this makes sense conceptually, it might not result in the most computationally efficient implementation. To minimize computational complexity, it is usually more efficient to integrate either one or both equalization blocks into the mixing algorithm. Since this is only a matter of implementation, the functionality is equivalent for all implementations, e.g., a separate realization of the equalization blocks as in FIG. 3 or an integrated version.

The functionality of the different elements shown in FIG. 3 is described in further detail in the following sections.

Mixer

Mixer 304 of FIG. 3 converts N audio channels into M audio channels. Mixer 304 can be realized using one or more of the following conventional schemes:

Matrixing: The output channels are derived from a linear combination of the input channels. This linear combination is described by an N×M matrix. The matrix typically has real and positive coefficients, where the same matrix is applied to the full audio bandwidth. See, e.g., M. Szczerba, F. do Bont, W. Oomen, and L. van de Kerkhof, "Matrixed Multi-Channel Extension for AAC Codec," 114$^{th}$ AES Conv. Amsterdam, March 22-25, no. preprint 5796, March 2003 ("the Szczerba paper"), and R. Irwan and R. M. Aarts, "Two-to-Five Channel Sound Processing," JAES, vol. 50, no. 11, pp. 915-926, November 2002 ("the Irwan paper"), the teachings of both of which are incorporated herein by reference.

Creation of surround channels: For the generation of surround channels, delayed versions of the input channels can be used as a component for the output surround channels. Other techniques for de-correlation, such as 90° phase shifting can also be used for the same purpose. See, e.g., the Szczerba and Irwan papers.

Creation of a spatial image using spatial parameters (e.g., binaural cue coding (BCC)): The output channels are created by the mixer such that they have an inter-channel level difference, time difference, and cross-correlation as determined by the spatial parameters, which usually vary between sub-bands and over time. See, e.g., F. Baumgarte and C. Faller, "Binaural Cue Coding—Part I: Psychoacoustic Fundamentals and Design Principles," IEEE Trans. Speech and Audio Proc., vol. 11, no. 6, pp. 509-519, November 2003, and C. Faller and F. Baumgarte, "Binaural Cue Coding—Part II: Schemes and Applications," IEEE Trans. Speech and Audio Proc., vol. 11, no. 6, pp. 520-531, November 2003, the teachings of both of which ("the BCC papers") are incorporated herein by reference.

Depending on the implementation, mixer 304 can inherently perform some power equalization. For instance, in the case of matrixing, the matrix coefficients are usually normalized such that power equalization is obtained. If power equalization is performed in the mixer, then it might be possible to skip the processing of power/magnitude equalizer 306 for those sub-bands in which power equalization would otherwise be applied in order to reduce coloration. Conceptually, mixer 304 is that part of the equalized mixing scheme that determines the spatial auditory image of the output channels. However, it does not necessarily provide minimum coloration.

Power/Magnitude Estimation Blocks and Equalizer

Theoretical analysis and simulations indicate that coloration can be reduced by using power equalization at medium and high audio frequencies, while using magnitude equalization at low audio frequencies for loudspeaker playback. Power and magnitude equalization do not change the spatial image; they only amplify or attenuate the audio channels dynamically (time-dependent) in the sub-bands. The spatial image is virtually unchanged, because the attenuation or amplification is equal for all channels. From this perspective, power/magnitude equalizer 306 can be thought of as a dynamically adjusted filter that is applied to all mixer output channels. The dynamic adjustment is based on the short-term power and/or amplitude estimates of the mixer input and output channels generated by estimation blocks 310 and 312, respectively.

For the following discussions of power and magnitude estimation and equalization, each of the N input channels and M output channels is assumed to be divided into B frequency sub-bands, where mixing with magnitude equalization is applied to sub-band 1 (i.e., the lowest-frequency sub-band) through sub-band $B_H$, while mixing with power equalization is applied to sub-band $B_H+1$ through sub-band B (i.e., the highest-frequency sub-band), where sub-band $B_H$ corresponds to a specified cut-off frequency (e.g., 1 kHz).

Power Estimation and Equalization

For each sub-band subjected to power equalization, the amplitude of each output channel is scaled such that, for all such sub-bands, the short-term energy estimate sum over all output channels is equal to the short-term energy estimate sum over all input channels.

When equalized mixer 300 performs mixing with power equalization, estimation block 310 (e.g., recursively) estimates the power of each input channel $X_n$ to mixer 304, estimation block 312 (e.g., recursively) estimates the power of each output channel $Y_m$ from mixer 304, and equalizer 306 performs power equalization. In particular, the power estimate $|T_{n,b,i}|^2$ for current frame i generated by estimation block 310 for frequency sub-band b of mixer input channel n is given by Equation (1) as follows:

$$|T_{n,b,i}|^2 = (1 - w_T)|T_{n,b,i-1}|^2 + w_T \sum_{v=V(b)}^{V(b+1)-1} |S_{n,v,i}|^2 \text{ for} \quad (1)$$

$$b = (B_H + 1), \dots, B \text{ and}$$

$$n = 1, \dots, N,$$

where:

- $|T_{n,b,i-1}|^2$ is the power estimate for the previous frame i−1 of frequency sub-band b of mixer input channel n, where the initial power estimate $|T_{n,b,0}|^2$ can be initialized to zero;
- $S_{n,v,i}$ is the current complex FFT spectral value (i.e., a sample of the complex spectrum derived by application of a fast Fourier transform) for mixer input channel n at frequency index v of sub-band b;
- sub-band b has FFT spectral value indices v from V(b) to V(b+1)−1, where the function V defines the spectral value indices that correspond to the sub-band boundaries; e.g., V(1)=1 is the index of the spectral value representing the lowest frequency, which is in sub-band 1; and
- $w_T$ is a constant weighting factor in the range ]0,1] that is optionally used for smoothing the power estimates over time.

Similarly, the current power estimate $|T_{m,b,i}|^2$ generated by estimation block 312 for frequency sub-band b of mixer output channel m is given by Equation (2) as follows:

$$|T_{m,b,i}|^2 = (1 - w_T)|T_{m,b,i-1}|^2 + w_T \sum_{v=V(b)}^{V(b+1)-1} |S_{m,v,i}|^2 \text{ for} \quad (2)$$

$$b = (B_H + 1), \dots, B \text{ and}$$

$$m = 1, \dots, M,$$

where:

- $|T_{m,b,i-1}|^2$ is the previous power estimate of frequency sub-band b of mixer output channel m, where the initial power estimate $|T_{m,b,0}|^2$ can be initialized to zero; and
- $S_{m,v,i}$ is the current complex FFT spectral value for mixer output channel m at frequency index v of sub-band b.

Equalizer 306 uses these input and output channel power estimates from input and output estimation blocks 310 and 312 to generate a current scaling factor $\overline{F}_{b,i}$ for each frequency sub-band b from sub-band $(B_H+1)$ through sub-band B according to Equation (3) as follows:

$$\overline{F}_{b,i} = \left( \frac{\sum_{n=1}^{N} |T_{n,b,i}|^2}{\sum_{m=1}^{M} |T_{m,b,i}|^2} \right)^{1/2} \text{ for } b = (B_H + 1), \dots, B. \quad (3)$$

Equalizer 306 applies the scaling factors $\overline{F}_{b,i}$ to the FFT spectral values $S_{m,v,i}$ according to Equation (4) as follows:

$$\overline{S}_{m,v,i} = \overline{F}_{b,i} S_{m,v,i} \text{ for } v = V(b), \dots, V(b+1)-1,$$
$$b = (B_H+1), \dots, B, \text{ and } m = 1, \dots, M, \quad (4)$$

where $\overline{S}_{m,v,i}$ are the complex FFT spectral values for equalized output channel $Y'_m$ for frequency sub-bands $B_H+1$ through B.

Magnitude Estimation and Equalization

For each sub-band subjected to magnitude equalization, the amplitude of each output channel is scaled such that, for all such sub-bands, the magnitude of a sum of short-term complex amplitude estimates for all output channels (e.g., an amplitude sum magnitude for the output channels) is equal to the magnitude of a sum of short-term complex amplitude estimates for all input channels (e.g., an amplitude sum magnitude for the input channels).

When equalized mixer 300 performs mixing with magnitude equalization, estimation block 310 (e.g., recursively) estimates the amplitude of each input channel $X_n$ to mixer 304, estimation block 312 (e.g., recursively) estimates the amplitude of each output channel $Y_m$ from mixer 304, and equalizer 306 performs magnitude equalization. In particular, the current amplitude estimate $U_{n,b,i}$ generated by estimation block 310 for frequency sub-band b of mixer input channel n is given by Equation (5) as follows:

$$U_{n,b,i} = (1 - w_U)U_{n,b,i-1} + w_U \sum_{v=V(b)}^{V(b+1)-1} S_{n,v,i} \text{ for} \quad (5)$$

$$b = 1, \dots, B_H \text{ and}$$

$$n = 1, \dots, N,$$

where:

- $U_{n,b,i-1}$ is the previous amplitude estimate of frequency sub-band b of mixer input channel n, where the initial amplitude estimate $U_{n,b,0}$ can be initialized to zero; and
- $w_U$ is a constant weighting factor in the range ]0,1] that is optionally used for smoothing the amplitude estimates over time.

Similarly, the current amplitude estimate $U_{m,b,i}$ generated by estimation block 312 for frequency sub-band b of mixer output channel m is given by Equation (6) as follows:

$$U_{m,b,i} = (1 - w_U)U_{m,b,i-1} + w_U \sum_{v=V(b)}^{V(b+1)-1} S_{m,v,i} \text{ for} \quad (6)$$

$$b = 1, \dots, B_H \text{ and}$$

$$m = 1, \dots, M,$$

where:

$U_{m,b,i-1}$ is the previous amplitude estimate of frequency sub-band b of mixer output channel m, where the initial amplitude estimate $U_{m,b,0}$ can be initialized to zero.

Equalizer 306 uses these input and output channel amplitude estimates from input and output estimation blocks 310 and 312 to generate a current scaling factor $\overline{F}_{b,i}$ for each frequency sub-band b from sub-band 1 through sub-band $B_H$ according to Equation (7) as follows:

$$\overline{F}_{b,i} \propto \sqrt{\frac{M}{N} \frac{\left|\sum_{n=1}^{N} U_{n,b,i}\right|}{\left|\sum_{m=1}^{M} U_{m,b,i}\right|}} \text{ for } b = 1, \ldots, B_H, \quad (7)$$

where "∝" means "is proportional to." Although the left- and right-hand sides of Equation (7) may be equal to each other, equality is not strictly required in order to reduce coloration. Equalizer 306 applies the scaling factors $\overline{F}_{b,i}$ to the FFT spectral values $S_{m,v,i}$, according to Equation (8) as follows:

$$\overline{S}_{m,v,i} = \overline{F}_{b,i} S_{m,v,i} \text{ for } v=V(b), \ldots, V(b+1)-1,$$
$$b=1, \ldots, B_H, \text{ and } m=1, \ldots, M, \quad (8)$$

where $\overline{S}_{m,v,i}$ are the complex FFT spectral values for equalized output channel $Y'_m$ for frequency sub-bands 1 through $B_H$.

After equalizer 306 performs magnitude equalization, an amplitude sum magnitude for the equalized output channels is related to an amplitude sum magnitude for the input channels according to Equation (9) as follows:

$$\frac{1}{\sqrt{M}}\left|\sum_{m=1}^{M} \overline{U}_{m,b,i}\right| \propto \frac{1}{\sqrt{N}}\left|\sum_{n=1}^{N} U_{n,b,i}\right| \text{ for } b = 1, \ldots, B_H, \quad (9)$$

where equality of the left- and right-hand sides of Equation (9) may exist but is not required for coloration reduction, and the current amplitude estimate $\overline{U}_{m,b,i}$ for frequency sub-band b of equalized output channel m is given by Equation (10) as follows:

$$\overline{U}_{m,b,i} = (1 - w_U)\overline{U}_{m,b,i-1} + w_U \sum_{v=V(b)}^{V(b+1)-1} \overline{S}_{m,v,i} \text{ for} \quad (10)$$

$b = 1, \ldots, B_H$ and
$m = 1, \ldots, M,$ where:

$\overline{U}_{m,b,i-1}$ is the previous amplitude estimate of frequency sub-band b of equalized output channel m, where the initial amplitude estimate $\overline{U}_{m,b,0}$ can be initialized to zero; and $\overline{S}_{m,v,i}$ are the complex FFT spectral values given by Equation (8).

Power/Magnitude Equalization for BCC Down-Mixing and Up-Mixing

As described in the BCC papers, in binaural cue coding, a number of input channels are down-mixed in a BCC encoder to a fewer number of sum signals. These one or more sum signals are then transmitted along with BCC codes (e.g., based on inter-channel level difference (ICLD), inter-channel time difference (ICTD), and inter-channel correlation (ICC) data) to a BCC decoder, which applies the BCC codes to up-mix the one or more sum signals into a larger number of synthesized output signals (e.g., the same number as the number of original input channels).

According to one implementation of the present invention, in which the BCC encoder generates a single sum signal and the BCC codes are based only on ICLD data, power equalization is applied in the BCC encoder when generating the high-frequency sub-bands (e.g., those having center frequencies greater than or equal to 1 kHz) of the sum signal. In particular, for the high-frequency sub-bands, the sum signal is generated by adding the corresponding FFT spectral values for all of the input channels and equalizing the energy by ensuring that the short-time spectral energy of the sum signal is the same as the short-time spectral energy sum of all input channels.

For the low-frequency sub-bands (e.g., those having center frequencies less than 1 kHz), the sum signal is generated simply by adding the corresponding FFT spectral values for all of the input channels. No power equalization is applied, and magnitude equalization is not necessary since there is only one mixer output channel. (Note that, for BCC encoders that generate two or more sum signals, magnitude equalization based on Equations (5)-(8) should be performed to reduce coloration.)

An optional frequency-independent scaling factor may be applied to adapt the sum-signal level to the available dynamic range, which is usually limited due to numerical representation in the hardware/software.

According to this implementation of the present invention, the BCC decoder will receive the single sum signal (for which the high-frequency sub-bands will have had power equalization applied and the low-frequency sub-bands will have had no equalization applied) and the ICLD cue code data. The decoder generates scale factors from the ICLD cue code data and applies those scale factors to the sum signal to generate two or more synthesized output channels, according to Equation (11) as follows:

$$S_{m,v} = F_{m,v} \cdot S_{sum,v}, \quad (11)$$

where:

$S_{sum,v}$ is the complex FFT spectral value for frequency index v of the sum signal;

$S_{m,v}$ is the complex FFT spectral value for frequency index v of output channel m; and $F_{m,v}$ is the scale factor for frequency index v of output channel m, as given by Equations (12) and (13) as follows:

$$F_{1,v} = \left(1 + \sum_{m=1}^{M-1} 10^{\Delta L_{m,v}/10}\right)^{-\frac{1}{2}} \quad (12)$$

$$F_{m,v} = F_{1,v} \cdot 10^{\Delta L_{m-1,v}/20} \text{ for} \quad (13)$$
$m = 2, \ldots, M,$ where $\Delta L_{m,v}$ is the estimated ICLD between output channel 1 and output channel m+1. In a BCC scheme in which decoder is configured to synthesize channels corresponding to the channels input to the encoder, the estimated ICLDs may be assumed to be equal to ICLD codes generated by the encoder and transmitted to the decoder.

Using the scale factors $F_{m,v}$ derived from Equations (12) and (13) in Equation (11) corresponds to a combination of up-mixing and power equalization, because these power-equalized scale factors $F_{m,v}$ satisfy Equation (14) as follows:

$$\sum_{m=1}^{M} |F_{m,v}|^2 = 1. \tag{14}$$

Instead of equalizing the short-time spectral energy of the sum signal and the short-time spectral energy of all of the synthesized output channels, for the low-frequency sub-bands, the magnitude of the sum signal is equalized to the magnitude of a sum of the amplitudes of all of the synthesized output channels. This can be achieved by modifying the power-equalized scale factors $F_{m,v}$ for the low-frequency sub-bands according to Equation (15) as follows:

$$F'_{m,v} = \frac{F_{m,v}}{\left|\sum_{m=1}^{M} F_{m,v}\right|}. \tag{15}$$

These magnitude-equalized scale factors $F'_{m,v}$, which satisfy Equation (16) as follows:

$$\left|\sum_{m=1}^{M} F'_{m,v}\right| = 1, \tag{16}$$

are then used in Equation (11) instead of the power-equalized scale factors $F_{m,v}$.

Loudness Equalizer

Loudness equalizer 307 can be optionally used to provide a refinement to the coloration reduction performed by power/magnitude equalizer 306. While the power/magnitude equalization of equalizer 306 is based only on power and/or amplitude estimates, the loudness equalization of equalizer 307 can provide better loudness adjustment by taking into account more parameters. Specifically, the loudness equalizer gain G can be derived taking into account the audio frequency, the inter-channel level difference, and/or the inter-channel correlation. Since the loudness equalization gain G' is preferably applied equally to all channels, it does not affect the spatial image. In general, G' can vary dynamically over time and/or have different values for the different sub-bands.

Alternative Embodiments

Although equalized mixer 300 has been depicted with N different transform blocks operating in parallel and M different inverse transform blocks operating in parallel, in alternative embodiments, as few as one transform block and/or as few as one inverse transform block can be operated in a serial, time-multiplexed manner to process multiple, different signals. Similarly, an equalized mixer of the present invention can be implemented using a single power/magnitude estimator that generates overall spectral loudness measures for both the N input channel signals and the M mixed channel signals.

The present invention can be implemented in the context of continuous time t and continuous frequency ω. Alternatively, the present invention can be implemented in discrete time and discrete frequency, e.g., using a discrete Fourier transform (DFT). Moreover, the present invention is not limited to Fourier transforms, be they continuous or discrete. In general, the present invention can be implemented using any suitable orthogonal transform or filter bank that is, preferably, energy preserving. In theory, it is also possible to implement the equalized mixing of the present invention in the time domain using adaptive filtering.

The present invention may be implemented as circuit-based processes, including possible implementation on a single integrated circuit. As would be apparent to one skilled in the art, various functions of circuit elements may also be implemented as processing steps in a software program. Such software may be employed in, for example, a digital signal processor, micro-controller, or general-purpose computer.

The present invention can be embodied in the form of methods and apparatuses for practicing those methods. The present invention can also be embodied in the form of program code embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

It will be further understood that various changes in the details, materials, and arrangements of the parts which have been described and illustrated in order to explain the nature of this invention may be made by those skilled in the art without departing from the scope of the invention as expressed in the following claims.

I claim:

1. A computer-implemented method for generating M output audio channels from N input audio channels, where N and M are positive integers, the method comprising:
   (a) the computer mixing the N input channels to generate M mixed channels; and
   (b) the computer equalizing the M mixed channels to generate the M output channels, wherein:
      for a first set of one or more frequency sub-bands, step (b) comprises scaling the amplitude of each of the M mixed channels such that an amplitude sum magnitude for the M output channels is substantially equal to an amplitude sum magnitude for the N input channels; and
      for each frequency sub-band in the first set, step (b) comprises:
      (1) the computer estimating the amplitude of each of the N input channels;
      (2) the computer estimating the amplitude of each of the M mixed channels;
      (3) the computer generating scale factors based on the estimated amplitudes of the input and mixed channels; and
      (4) the computer applying the scale factors to the M mixed channels to generate the M output channels, wherein the scale factors are derived from binaural cue codes (BCCs) generated in a BCC encoder and applied in a BCC decoder.

2. The invention of claim 1, wherein, for the first set:
the amplitude sum magnitude for the M output channels is based on a magnitude of a sum of estimated amplitudes of the M output channels; and
the amplitude sum magnitude for the N input channels is based on a magnitude of a sum of estimated amplitudes of the N input channels.

3. The invention of claim 2, wherein, for the first set, the amplitude sum magnitudes for the N input channels and the M output channels satisfy the following equation:

$$\frac{1}{\sqrt{M}}\left|\sum_{m=1}^{M} \overline{U}_{m,b,i}\right| \propto \frac{1}{\sqrt{N}}\left|\sum_{n=1}^{N} U_{n,b,i}\right|$$

where:
$\overline{U}_{m,b,i}$ an amplitude estimate for frequency sub-band b of equalized output channel m at time i and
$U_{n,b,i}$ is an amplitude estimate for frequency sub-band b of input channel n at time i.

4. The invention of claim 1, wherein, for a second set of one or more frequency sub-bands, step (b) comprises scaling the amplitude of each of the M mixed channels such that a sum of the powers of the M output channels is substantially equal to a sum of the powers of the N input channels.

5. The invention of claim 4, wherein:
the first set comprises any frequency sub-band below a specified threshold frequency; and
the second set comprises any frequency sub-band above the specified threshold frequency.

6. The invention of claim 5, wherein the specified threshold frequency is about 1 kHz.

7. The invention of claim 1, wherein the scale factors substantially satisfy the following equation:

$$\left|\sum_{m=1}^{M} F'_{m,v}\right| = 1,$$

where N=1 and $F'_{m,v}$ is a scale factor that is used to scale the amplitude of mixed channel m at frequency index v to generate output channel m at frequency index v.

8. The invention of claim 1, wherein the estimated amplitudes are smoothed over time.

9. An apparatus for generating M output audio channels from N input audio channels, where N and M are positive integers, the apparatus comprising:
an input estimation block adapted to estimate amplitudes of the N input channels for a first set of one or more frequency sub-bands;
a mixer adapted to mix the N input channels to generate M mixed channels;
an output estimation block adapted to estimate amplitudes of the M mixed channels for the first set; and
an equalizer adapted to equalize the M mixed channels to generate the M output channels, wherein:
for the first set, the equalizer is adapted to scale the amplitude of each of the M mixed channels such that a magnitude of a sum of the estimated amplitudes of the M output channels is substantially equal to a magnitude of a sum of the estimated amplitudes of the N input channels; and
for each frequency sub-band in the first set, the equalizer is adapted to:
generate scale factors based on the estimated amplitudes of the input and mixed channels; and
apply the scale factors to the M mixed channels to generate the M output channels, wherein the scale factors are derived from binaural cue codes (BCCs) generated in a BCC encoder and applied in a BCC decoder.

10. The invention of claim 9, wherein, for the first set, the magnitudes for the N input channels and the M output channels satisfy the following equation:

$$\frac{1}{\sqrt{M}}\left|\sum_{m=1}^{M} \overline{U}_{m,b,i}\right| \propto \frac{1}{\sqrt{N}}\left|\sum_{n=1}^{N} U_{n,b,i}\right|$$

where:
$\overline{U}_{m,b,i}$ is an amplitude estimate for frequency sub-band b of equalized output channel m at time i and
$\overline{U}_{n,b,i}$ is an amplitude estimate for frequency sub-band b of input channel n at time i.

11. The invention of claim 9, wherein the mixer, the input and output estimation blocks, and the equalizer are implemented as a single integrated processing element.

12. The invention of claim 9, wherein the apparatus is adapted to smooth the estimated amplitudes over time.

13. The invention of claim 9, for a second set of one or more frequency sub-bands:
the input estimation block is adapted to estimate powers of the N input channels;
the output estimation block is adapted to estimate powers of the M mixed channels; and
the equalizer is adapted to scale the amplitude of each of the M mixed channels such that a sum of the powers of the M output channels is substantially equal to a sum of the powers of the N input channels.

14. The invention of claim 13, wherein:
the first set comprises any frequency sub-band below a specified threshold frequency; and
the second set comprises any frequency sub-band above the specified threshold frequency.

15. The invention of claim 14, wherein the specified threshold frequency is about 1 kHz.

16. The invention of claim 9, wherein the scale factors substantially satisfy the following equation:

$$\left|\sum_{m=1}^{M} F'_{m,v}\right| = 1,$$

where N=1 and $F'_{m,v}$ is a scale factor that is used to scale the amplitude of mixed channel m at frequency index v to generate output channel m at frequency index v.

17. The invention of claim 9, further comprising:
one or more transform blocks adapted to convert an N-channel time-domain input audio signal into the N input channels in a frequency-domain; and
one or more inverse transform blocks adapted to convert the M output channels in the frequency-domain into an M-channel time-domain output audio signal.

18. The invention of claim 9, further comprising a loudness equalizer adapted to scale the M output channels based on a loudness gain function.

* * * * *

UNITED STATES PATENT AND TRADEMARK OFFICE
CERTIFICATE OF CORRECTION

PATENT NO. : 7,639,823 B2
APPLICATION NO. : 10/853394
DATED : December 29, 2009
INVENTOR(S) : Frank Baumgarte Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1618 days.

Signed and Sealed this

Twenty-first Day of December, 2010

David J. Kappos
*Director of the United States Patent and Trademark Office*